(12) United States Patent
Ravi et al.

(10) Patent No.: US 7,071,552 B2
(45) Date of Patent: Jul. 4, 2006

(54) IC DIE WITH DIRECTLY BONDED LIQUID COOLING DEVICE

(75) Inventors: Kramadhati V. Ravi, Atherton, CA (US); Ravi S. Prasher, Tempe, AZ (US); Gregory M. Chrysler, Chandler, AZ (US)

(73) Assignee: Intel Corporation, Santa Clara, CA (US)

( * ) Notice: Subject to any disclaimer, the term of this patent is extended or adjusted under 35 U.S.C. 154(b) by 44 days.

(21) Appl. No.: 10/813,187

(22) Filed: Mar. 29, 2004

(65) Prior Publication Data

US 2005/0212121 A1   Sep. 29, 2005

(51) Int. Cl.
 *H01L 23/34* (2006.01)
(52) U.S. Cl. ...................... 257/712; 257/714
(58) Field of Classification Search ............... 257/712, 257/714

See application file for complete search history.

(56) References Cited

U.S. PATENT DOCUMENTS

| | | | |
|---|---|---|---|
| 5,901,037 A * | 5/1999 | Hamilton et al. ........... 361/699 |
| 6,351,387 B1 | 2/2002 | Prasher |
| 6,365,821 B1 | 4/2002 | Prasher |
| 6,381,135 B1 | 4/2002 | Prasher et al. |
| 6,469,893 B1 | 10/2002 | Frutschy et al. |
| 6,504,721 B1 | 1/2003 | Watwe et al. |
| 6,609,561 B1 | 8/2003 | Sauciuc et al. |
| 6,650,542 B1 | 11/2003 | Chrysler et al. |

* cited by examiner

*Primary Examiner*—Roy Potter
(74) *Attorney, Agent, or Firm*—Schwabe, Williamson & Wyatt, P.C.

(57) ABSTRACT

An apparatus includes an integrated circuit (IC) die having a substrate formed of a first semiconductor material and a cooling device form of a second semiconductor material. The cooling device is directly mounted to the substrate of the IC die.

16 Claims, 6 Drawing Sheets

IC DIE WITH DIRECTLY BONDED LIQUID COOLING DEVICE

BACKGROUND OF THE INVENTION

1. Field of the Invention

The present invention relates to electronic devices, and in particular, to cooling of electronic devices.

2. Description of Related Art

Referring to FIG. 1, an integrated circuit (IC) chip or die 10 (i.e., silicon die or chip) may be mounted in a wide array of IC packages in the prior art. For high-power processor chips, a heat sink 12, such as a copper heat sink, may be placed in contact with a chip 10 to remove heat from the chip 10. In some prior art designs, an integrated heat spreader (IHS) lid of the IC package (not shown) may be placed between the heat sink 12 and the chip 10 to facilitate cooling the chip 10. The IC package, and the heat sink 12 attached to the IC package, may be mounted to a printed circuit board (PCB) with or without the inclusion of a socket.

With current prior art practices, the chip 10 may be coupled to the heat sink 12 (or IHS lid if included) using thermal interface material 14, such as a polymer based thermal interface material or indium solder. Neither of these approaches may handle the increased thermal loads of future processor chips. It is projected that future processor chips may dissipate as much as 200 Watts of power.

DETAILED DESCRIPTION OF ILLUSTRATIVE EMBODIMENTS

In the following description, for purposes of explanation, numerous details are set forth in order to provide a thorough understanding of the disclosed embodiments of the present invention. However, it will be apparent to one skilled in the art that these specific details are not required in order to practice the disclosed embodiments of the present invention. In other instances, well-known electrical structures and circuits are shown in block diagram form in order not to obscure the disclosed embodiments of the present invention.

Figure 2:
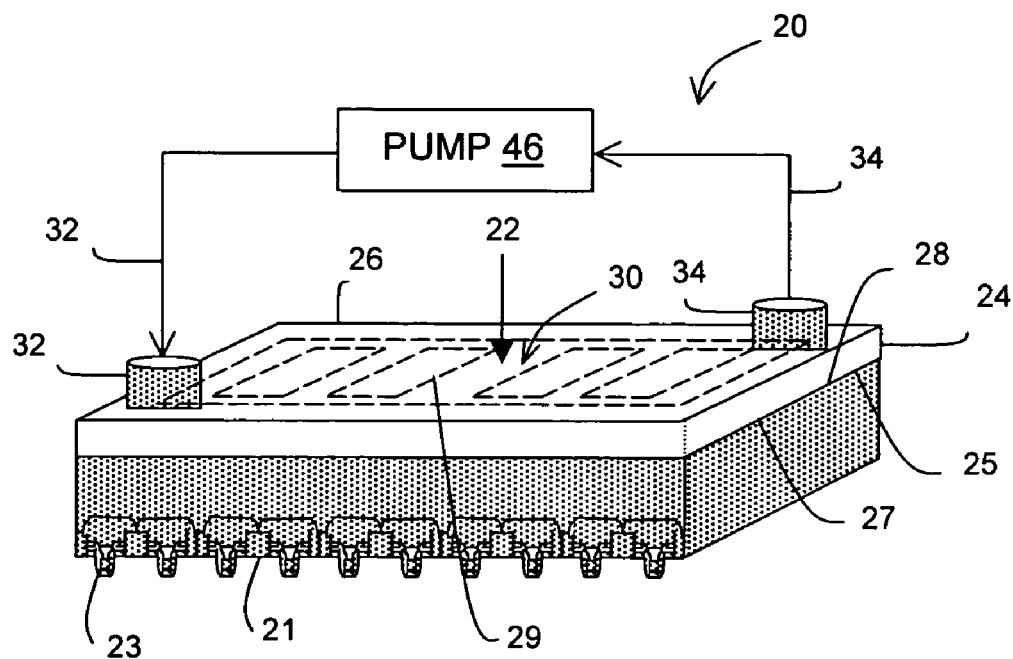
FIG. 2 is a perspective view of an electronic assembly, in accordance with one embodiment of the invention.

In FIG. 2 there is illustrated an electronic assembly 20, in accordance with one embodiment of the present invention, which includes an integrated circuit (IC) chip or die 21 and a liquid cooling device 22 mounted to the die 21. As will be described in more detail below, the liquid cooling device 22 is formed of a semiconductor material (e.g., silicon material) and is directly bonded to a like semiconductor material substrate (e.g., silicon substrate) of the die 21. The die 21 contains IC circuitry and has a plurality of electrical contacts 23. The contacts 23 may provide for electrical connection between the die 21 and an IC package (see FIG. 7) in which the die 21 may be mounted. Alternatively, the electrical contacts 23 of the die 21 may be directly connected to a printed circuit board (PCB) or substrate (see FIG. 7), eliminating the packaging interconnect level between the die 21 and the IC package. The contacts 23 may take different forms of die attachment, e.g., bonding pads, fingers, pins, and the contacts 23 may be aligned in different configurations, e.g., arrays and rows. Merely for the purposes of illustration one example, the IC die 21 is shown with two opposed rows of contacts 23. The IC die 21 may incorporate integrated circuits serving a wide range of functions, such as that of a microprocessor. The IC die 21 may be manufactured using a wide range of possible chip manufacturing techniques and designs.

The cooling device 22 includes a cooling plate 24, made of made of a block of semiconductor material (e.g., silicon), which is mounted to the IC die 21. The cooling plate 24 has a first cooling plate side 25 and a second cooling plate side 26. The first cooling plate side 25 of the cooling plate 24 may be bonded to a backside or substrate 27 of the IC die 21 by a direct semiconductor material-to-semiconductor material bond 28. The semiconductor materials of the cooling plate 24 and the substrate 27 may be the same, e.g., silicon, or sufficiently alike as to allow direct bonding. When the semiconductor material of the cooling plate 24 and IC die 21 is silicon, then the bond 28 may be described as a silicon-to-silicon bond. By attaching the substrate 27 of the IC die 21 using this direct wafer bonding approach, solders and other bonding media may be eliminated. The cooling plate 24 may be similarly configured in its width and length to match the dimensions of the IC die 21, with a depth of any desired thickness.

The cooling plate 24 includes on the first cooling plate side 25 a plurality of interconnected grooves or channels 29, which may be cut into the interior of the cooling plate 24. For illustration purposes only, the channels 29 are shown in FIG. 2 with a substantially U-shaped cross-sectional surface configuration, but other cross-sectional configurations may be possible. The channels 29 may be cut into the first cooling plate side 25, which faces toward and is bonded to the IC die 21. The bonding of the first cooling plate side 25 to the substrate 27 of the IC die 21 causes the channels 29 in the cooling plate 24 to be enclosed so as to form a plurality of interconnected, tubular, enclosed, liquid-conducting passages 30 within the interior of the electronic assembly 20. The liquid-conducting passages 32 act as conduits for the flow a cooling liquid, such as water or alcohol based liquid. In other words, each of the liquid-conducting passages 30 may be formed from one of the channels 29 and the substrate 27 of the IC die 21. In this embodiment, the substrate 27 of the IC die 21 forms part of the cooling device 22, i.e., in the sense that it completes the enclosure of the channels 29 to form the liquid-conducting passages 30. In other embodiments, the IC die 21 may not be part of the cooling device, as explained hereinafter.

Referring to FIGS. 2 and 3, the cooling device 22 may include a liquid feed tube 32 and a liquid exit tube 34. The tubes 32 and 34 may be fluidly coupled to the second cooling plate side 26 of the cooling plate 24. More specifically, the liquid feed tube 32 is connected to a liquid inlet 38, which is formed by drilling a hole through the second cooling plate side 26 and into the interior of the cooling plate 24 to intercept the channels 29. The liquid exit tube 34 is connected to a liquid outlet 40, which is formed by drilling another hole through the second cooling plate surface 26 into interior of the cooling plate 24 to intercept the channels 29. Hence, the liquid inlet 38 and liquid outlet 40 fluidly connect the tubes 32 and 34, respectively, to the plurality of channels 29 and therefore to the plurality of liquid-conducting passages 30.

The channels 29 may be interconnected in a relative uniform pattern distributed through the cooling plate 24 so as to provide relatively uniform heat removal and minimize hot spots in the IC die 21. One such illustrative pattern is shown by a channel network 41 of channels 29 in FIG. 3. The channel network 41 may comprise a plurality of parallel channel segments 42, with each segment 42 being coupled at its ends to a pair of opposed, parallel channel segments 44. The channel segments 42 and 44 are cut into to the first cooling plate side 25, so that when covered by the IC die 21, the plurality of liquid-conducting passages 30 are formed. The cooling device 22 further includes a pump 46, which is coupled to tubes 32 and 34 for closed loop circulation of the cooling liquid. The pump 46 applies a fluid pressure so the cooling liquid circulates in a closed loop circulation path comprising the pump 46, the liquid feed tube 32, the liquid inlet 38, the liquid-conducting passages 30, the liquid outlet 40, and the liquid exit tube 34. The fluid inlet 38 and liquid outlet 40 may be coupled, respectively, to the channel network 41 at diagonally-opposed, peripheral corners 47 and 48 of the channel network 41.

Figure 1:
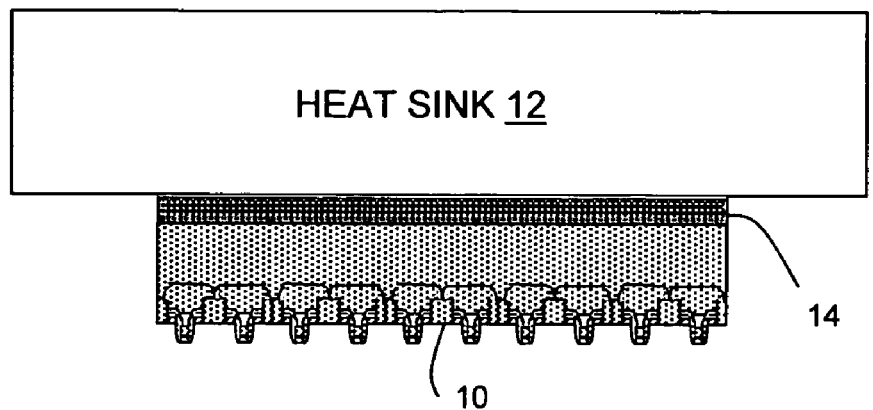
FIG. 1 is a generalized block diagram of a portion of a prior art IC package showing a chip and a heat sink.

Referring to FIG. 4, there is illustrated an electronic assembly 50, in accordance with another embodiment of the present invention. The electronic assembly 50 includes the IC die 21 and another embodiment of a liquid cooling device, the liquid cooling device 51, which is mounted on the IC die 21. In the cooling device 51, a cooling plate 52 may be inverted relative to the cooling plate 24 of FIG. 1. In other words, a plurality of interconnected channels 54 may be machined into a first cooling plate side 56 of the cooling plate 52, but in this embodiment, the first cooling plate side 56 faces away from the IC die 21. As a result, a second cooling plate side 58 of the cooling plate 52 may provide a solid interface between the IC die 21 and the cooling plate 24. The channels 54 may be arranged into a channel network of the same configuration as that shown in FIG. 3 for the first-described embodiment. The cooling device 51 further includes a cover plate 60, which has a first cover plate side 61 and a second cover plate side 62. The first cover plate side 61 is then mounted onto the first cooling plate side 56 so as to enclose the channels 54 and form a plurality of tubular, enclosed, liquid-conducting passages 55, which act as conduits for the flow of a cooling liquid.

The cover plate 60, like the cooling plate 52, may be made of polycrystalline silicon. Both a first bond 63 between IC die 21 and cooling plate 52 and a second bond 64 between the cooling plate 52 and cover plate 60 may be achieved through direct wafer bonding (i.e., silicon-to-silicon bonding), eliminating the interface material. A liquid feed tube 65 may provide a cooling liquid to the cooling plate 52 and a liquid exit tube 66 may remove the cooling liquid from the cooling plate 52, with both tubes 65 and 66 (partially shown via diagram lines) being coupled to the pump 46. The tubes 65 and 66 may be coupled at their other ends to the second cover plate side 62 of the cover plate 60, which faces away from the IC die 21. More specifically, the liquid feed tube 65 may be fluidly coupled to a liquid inlet 67 (shown in dashed lines) formed by a hole drilled all the way through the cover plate 60. Likewise, the liquid exit tube 66 may be fluidly coupled to a liquid outlet 68 formed by another hole drilled all the way through the cover plate 60.

Referring to FIGS. 2–4, in both of the electronic assemblies 20 and 50 according to the embodiments of the present invention, the liquid-conducting passages 30 and 55, respectively, are formed in the electronic assemblies by enclosing the channels with an "enclosing plate". More specifically, in the first embodiment according to FIGS. 2 and 3, the "enclosing plate" is the IC die 21, which mounted to the first cooling plate side 25 of the cooling plate 24 so as to enclose the channels 29 to form the liquid-conducting passages 30. In the second embodiment according to FIG. 4, the "enclosing plate" is the cover plate 60, which mounted to the first cooling plate side 56 of the cooling plate 52 so as to enclose the channels 54 to form the liquid-conducting passages 55. Hence, the term "enclosing plate" will be used in the claims appended hereto to generically refer to the IC die 21 of the first embodiment or the cover plate 60 of the second embodiment.

Figure 6A:
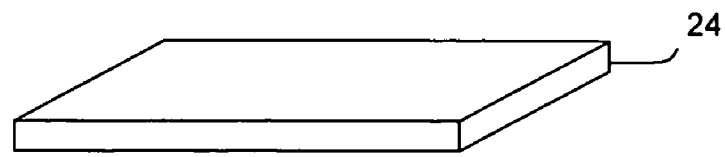
FIGS. 6A through 6E is a flow chart, in accordance with one method of the present invention, showing a plurality of stages that the electronic assembly of FIG. 2 passes through during the manufacturing process of FIG. 5.
Figure 6B:
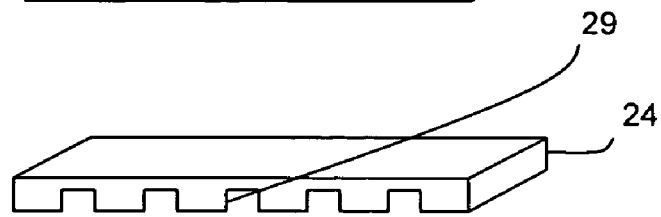
Figure 6C:
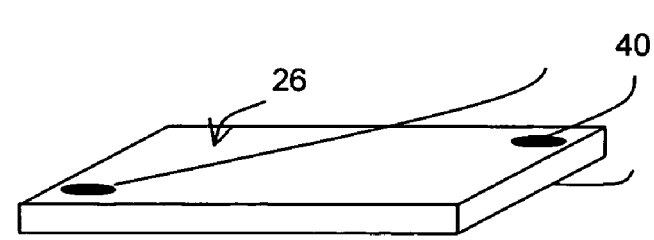
Figure 6D:
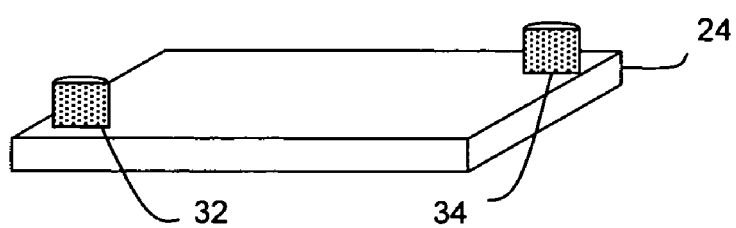
Figure 6E:
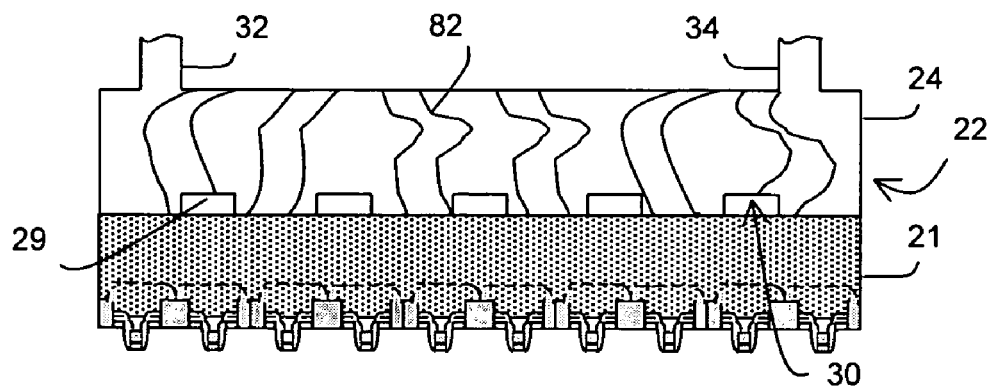

Referring to FIG. 5 and FIGS. 6A through 6E, there is shown a manufacturing process 70 for fabricating the cooling device 22 of FIG. 2 and for bonding the cooling device 22 to the IC die 21. The process 70 may start at block 72 of FIG. 5 with a silicon wafer. The silicon wafer may be made of low cost polycrystalline silicon, which may be fabricated from cast polycrystalline ingots. In block 72, the wafer may be cut into a plurality of cooling plates 24, with one being shown in FIG. 6A. The cooling plate 24 may be cut to have width and length dimensions corresponding to those of the backside of the IC die. In block 74 of FIG. 5, a plurality of interconnected channels 29 shown in FIG. 6B may be machined into the silicon of the cooling plate 24. The channels 29 may be machined into the cooling plate 24 utilizing techniques such a reactive ion etching, laser cutting or any other suitable cutting technique. In block 76 of FIG. 5, the pair of liquid flow holes shown in FIG. 6C may be drilled into the second cooling plate side 26 so that they intersect and couple with the channels 29 and thereby form the liquid inlet 38 and liquid outlet 40. In block 78 of FIG. 5, the liquid flow tube 32 and liquid exit tube 34 shown in FIG. 6D may be mounted on top of the liquid flow holes, i.e., the liquid inlet 38 and the liquid outlet 40, respectively. In block 80 of FIG. 6, the cooling plate 24 in FIG. 6E may be attached to the IC die 21 by direct silicon-to-silicon bonding so as to form the liquid-conducting passages 30 for the flow of the cooling liquid. For example, this silicon-to-silicon bonding may occur at a temperature 250 degrees centigrade for approximately 15 minutes. The lines 82 of FIG. 6E represent grain boundaries in the low cost polycrystalline wafer used to fabricate the cooling plate 24.

Referring to FIGS. 2 and 4, for the pump 46 a wide range of different types of pumps may be used, provided the pump fits within the chassis (not shown). For example, the pump 46 may be a centrifugal, piston or diaphragm pump. These pumps have moving parts and are connected to an actuator (e.g. motor) located either external or internal to the pump housing (not shown). A piezo diaphragm pump also has a moving part, but the actuator is the piezo diaphragm and is intrinsically part of the pump. Still another possibility for the pump 46 may be an electroosmotic pump. This pump has no moving parts at all. Regardless of the type of pump selected for the pump 46, it needs to provide a desired coolant flow rate. The flow rate may depend on the cooling requirement (power dissipation from the die 21) and the fluid properties of the coolant. In general, for single phase cooling (no boiling within the channels 29), the flow rate may be between 200 and 500 ml/min, or nominally 300 ml/min. If a boiling process is used in the channels 29, then the coolant flow rate may be between 20 and 50 ml/min, or nominally 30 ml/min.

Figure 7:
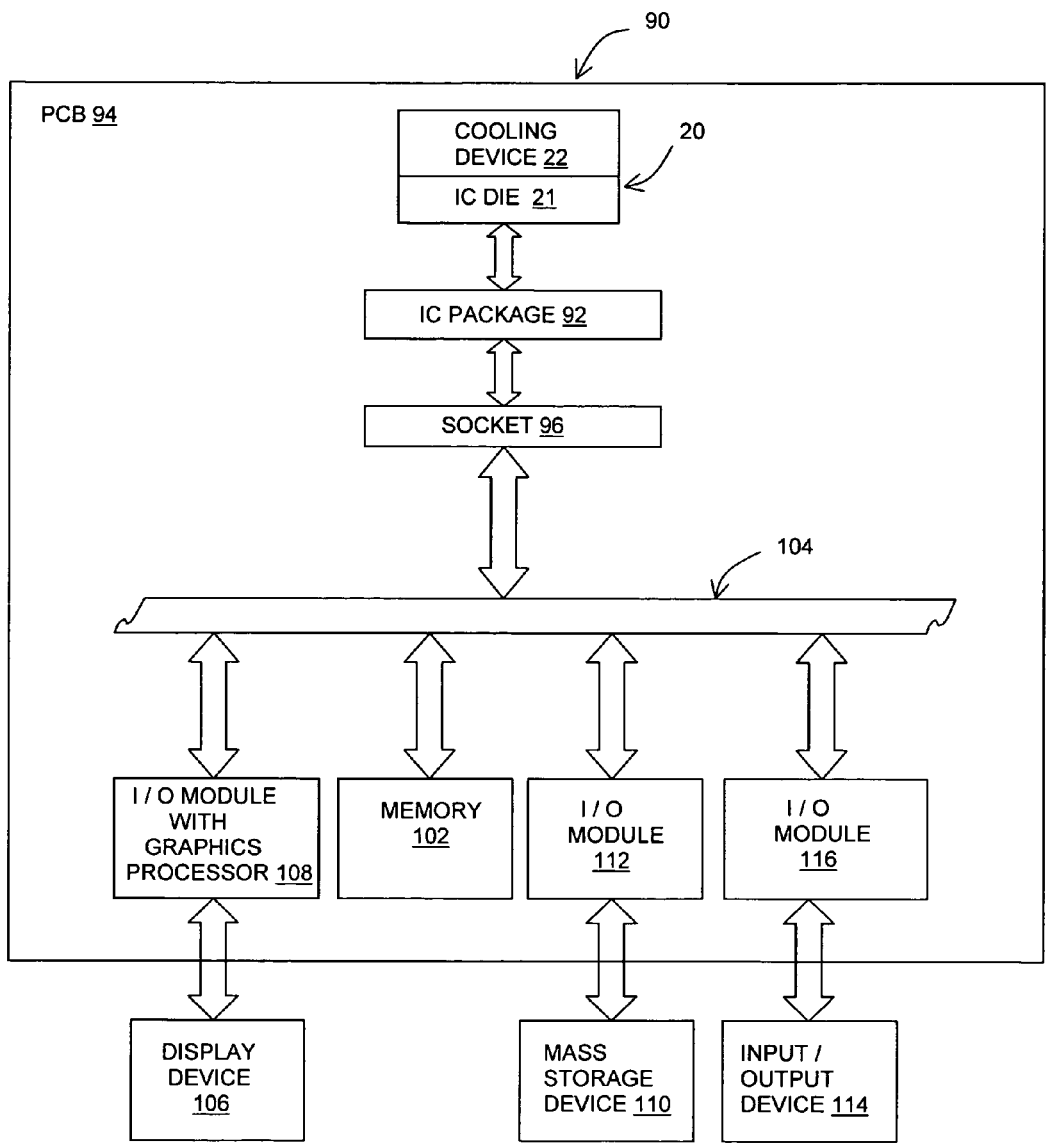
FIG. 7 is a block diagram of a system incorporating the electronic assemblies of FIGS. 2 and 4, in accordance to the embodiments of the present invention.

Referring to FIG. 7, there is illustrated a system 90, which is one of many possible systems in which the electronic assembly 20 of FIG. 2 and the electronic assembly 50 of FIG. 4 may be used. For the purposes of illustration, the electronic assembly 20 is shown in FIG. 7. In the system 90 the electronic assembly 20 is mounted in the IC package 92, which in turn is mounted on a substrate or printed circuit board (PCB) 94 via a socket 96. The IC die 21 of the electronic assembly 20 may be a processor and the PCB 92 may be a motherboard. However, in other systems the IC package 12 may be directly coupled to the PCB 92 (eliminating the socket 96 which allows the electronic assembly 20 to be removable) and in yet other systems the electronic assembly 20 may be directly mounted to the PCB 94 (eliminating the socket 96 and the IC package 92). In addition to the socket 96 and the IC package 92, the PCB 94 may have mounted thereon a main memory 102 and a plurality of input/output (I/O) modules for external devices or external buses, all coupled to each other by a bus system 104 on the PCB 94. More specifically, the system 90 may include a display device 106 coupled to the bus system 104 by way of an I/O module 108, with the I/O module 108 having a graphical processor and a memory. The I/O module 108 may be on the PCB 94 as shown in FIG. 7 or on a separate expansion board. The system 90 may further include a mass storage device 110 coupled to the bus system 104 via an I/O module 112. Another I/O device 114 may be coupled to the bus system 104 via an I/O module 116. Additional I/O modules may be included for other external or peripheral devices or external buses.

Examples of the memory 102 include, but are not limited to, static random access memory (SRAM) and dynamic random access memory (DRAM). The memory 102 may include an additional cache memory. Examples of the mass storage device 110 include, but are not limited to, a hard disk drive, a compact disk drive (CD), a digital versatile disk driver (DVD), a floppy diskette, a tape system and so forth. Examples of the input/output devices 114 may include, but are not limited to, devices suitable for communication with a computer user (e.g., a keyboard, cursor control devices, microphone, a voice recognition device, a display, a printer, speakers, and a scanner) and devices suitable for communications with remote devices over communication networks (e.g., Ethernet interface device, analog and digital modems, ISDN terminal adapters, and frame relay devices). In some cases, these communications devices may also be mounted on the PCB 94. Examples of the bus system 104 include, but are not limited to, a peripheral control interface (PCI) bus, and Industry Standard Architecture (ISA) bus, and so forth. The bus system 104 may be implemented as a single bus or as a combination of buses (e.g., system bus with expansion buses). Depending upon the external device, I/O modules internal interfaces may use programmed I/O, interrupt-driven I/O, or direct memory access (DMA) techniques for communications over the bus system 104. Depending upon the external device, external interfaces of the I/O modules may provide to the external device(s) a point-to point parallel interface (e.g., Small Computer System Interface—SCSI) or point-to-point serial interface (e.g., EIA-232) or a multipoint serial interface (e.g., FireWire). Examples of the IC die 21 may include any type of computational circuit such as, but not limited to, a microprocessor, a microcontroller, a complex instruction set computing (CISC) microprocessor, a reduced instruction set computing (RISC) microprocessor, a very long instruction word (VLIW) microprocessor, a graphics processor, a digital signal processor (DSP), or any other type of processor or processing circuit.

Although specific embodiments have been illustrated and described herein, it will be appreciated by those of ordinary skill in the art that any arrangement which is calculated to achieve the same purpose may be substituted for the specific embodiment shown. This application is intended to cover any adaptations or variations of the present invention. Therefore, it is manifestly intended that this invention be limited only by the claims and the equivalents thereof.

What is claimed is:

1. An apparatus, comprising:
   an integrated circuit (IC) die including a die surface formed with a first semiconductor material;
   a cooling device formed with a second semiconductor material; and
   the cooling device including a cooling plate having a first and a second cooling plate side and a plurality of interconnected channels being formed in the first cooling plate side, with the first cooling plate side being directly bonded to the die surface by a semiconductor material-to-semiconductor material bond to enclose the plurality of interconnected channels to form a plurality of liquid-conducting passages.

2. The apparatus according to claim 1, wherein the first and the second semiconductor materials are a same silicon material and the semiconductor material-to-semiconductor material bond is a silicon-to-silicon bond.

3. The apparatus according to claim 2, wherein the cooling device further includes a liquid inlet fluidly coupled to the plurality of liquid-conducting passages and a liquid outlet fluidly coupled to the plurality of liquid-conducting passages.

4. The apparatus according to claim 3, wherein the liquid inlet and liquid outlet are formed in the cooling plate and extend between the plurality of interconnected channels and the second cooling plate side.

5. The apparatus according to claim 3, wherein the cooling plate is formed of polycrystalline silicon fabricated from cast polycrystalline ingots.

6. The apparatus according to claim 3, further comprising:
   a pump;
   a liquid feed tube fluidly coupled between the pump and the liquid inlet; and
   a liquid exit tube fluidly coupled between the liquid outlet and the pump.

7. The apparatus according to claim 6, wherein the plurality of interconnected channels forms a channel network; and the channel network includes one pair of opposed channel segments and a plurality of parallel channel segments fluidly coupled between the opposed channel segments.

8. The apparatus according to claim 7, wherein the liquid inlet and liquid outlet are fluidly coupled at a pair of diametrically-opposed corners of the channel network.

9. A system, comprising:
   an electronic assembly including an integrated circuit (IC) die having a die surface formed with a first semiconductor material; the electronic assembly further including a cooling device formed with a second semiconductor material and having a cooling plate with a first and a second cooling plate side and a plurality of interconnected channels being formed in the first cooling plate side, with the first cooling plate side being directly bonded to the die surface by a semiconductor material-to-semiconductor material bond to enclose the plurality of interconnected channels to form a plurality of liquid-conducting passages;

an IC package having the electronic assembly mounted therein;

a printed circuit board (PCB) having the IC package mounted thereon;

a dynamic random access memory mounted on the PCB and electrically coupled to the electronic assembly; and an input/output interface mounted on the PCB and electrically coupled to the electronic assembly.

10. The system according to claim 9, wherein the IC die is a microprocessor; the PCB is a motherboard; and the input/output interface is a networking interface.

11. The system according to claim 9, wherein the first and the second semiconductor materials are a same silicon material and the semiconductor material-to-semiconductor material bond is a silicon-to-silicon bond.

12. The system according to claim 11, wherein the cooling device includes a liquid inlet and a liquid outlet formed in the cooling plate and disposed to extend between the plurality of interconnected channels and the second cooling plate side.

13. An apparatus, comprising:

an integrated circuit (IC) die including a die surface formed with a first semiconductor material;

a cooling device formed with a second semiconductor material;

the cooling device including a cooling plate having a first and a second cooling plate side with a plurality of interconnected channels being formed in the first cooling plate side;

a cover plate mounted to the first cooling plate side to enclose the plurality of interconnected channels to form a plurality of liquid-conducting passages;

the second cooling plate side of the cooling plate being directly bonded to the die surface by a first semiconductor material-to-semiconductor material bond; and the cover plate and the cooling plate each including a width and a length dimension substantially equal to a width and a length dimension of the die surface.

14. The apparatus according to claim 13, wherein the cover plate includes a first and a second cover plate side; the first cover plate side is attached to the first cooling plate side to form the liquid-conducting passages; and the liquid inlet and the liquid outlet are formed in the cover plate and extend from the first cover plate side to the second cover plate side.

15. The apparatus according to claim 14, wherein the cover plate is formed of a third semiconductor material; and the first cooling plate side is directly bonded to the first cover plate side by a second semiconductor material-to-semiconductor bond.

16. The apparatus according to claim 15, wherein each of the first, the second and the third semiconductor materials is a same silicon material; and each of the first and the second semiconductor material-to-semiconductor material bonds is a silicon-to-silicon bond.

* * * * *

UNITED STATES PATENT AND TRADEMARK OFFICE
CERTIFICATE OF CORRECTION

PATENT NO. : 7,071,552 B2 Page 1 of 1
APPLICATION NO. : 10/813187
DATED : July 4, 2006
INVENTOR(S) : Ravi et al.

Figure 3A:
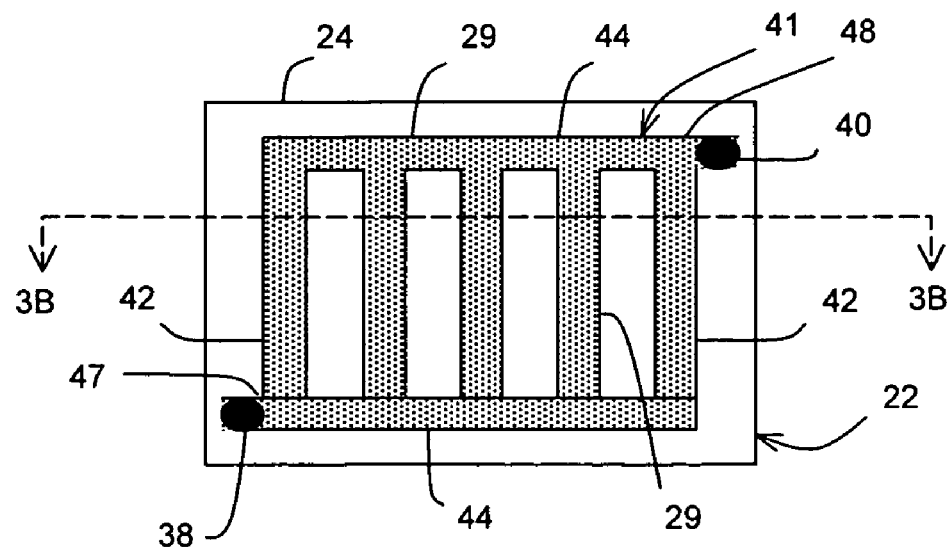
FIG. 3 is a cross-sectional view of the cooling plate shown in FIG. 2 which shows a network of channels in accordance with one embodiment of the invention.
Figure 3B:
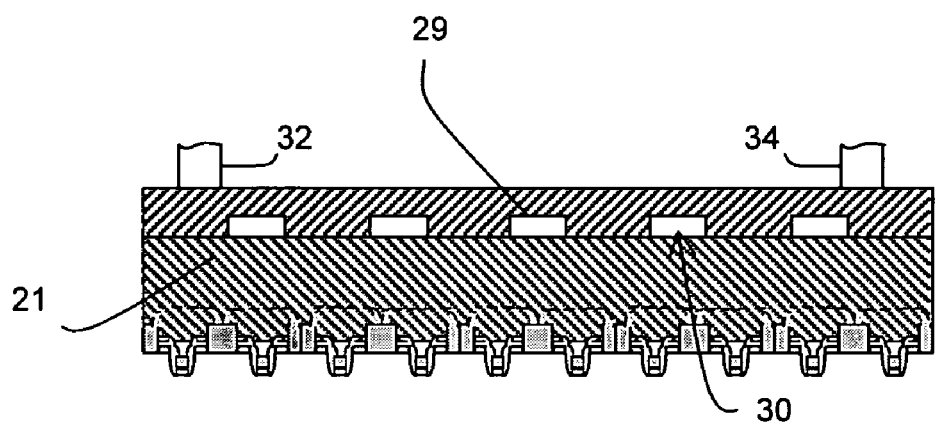
Figure 4A:
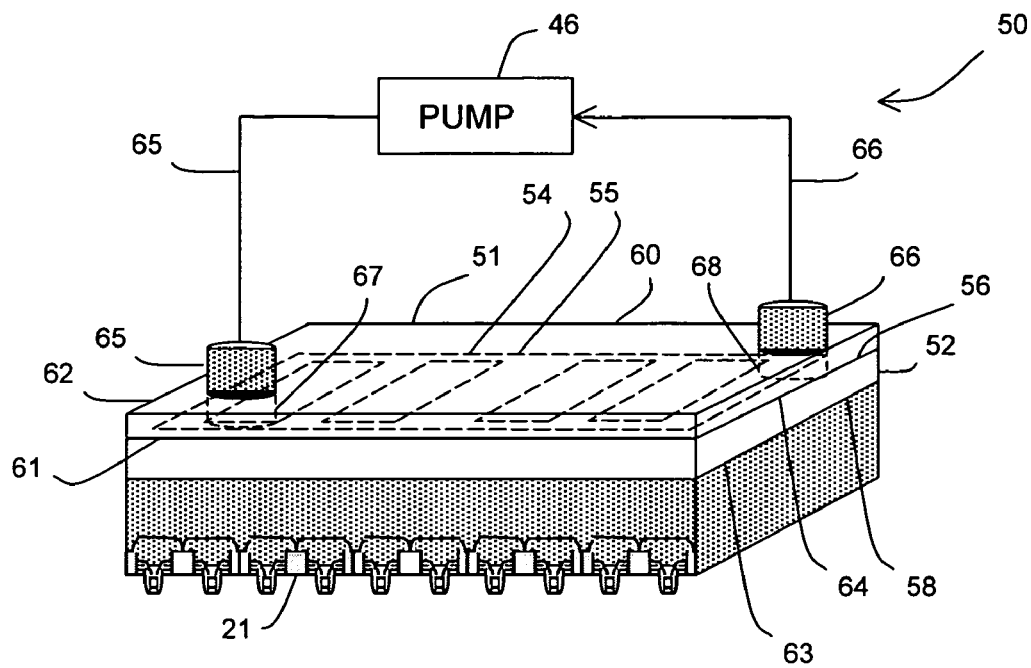
FIG. 4 is a perspective view of another electronic assembly, in accordance with another embodiment of the present invention.
Figure 4B:
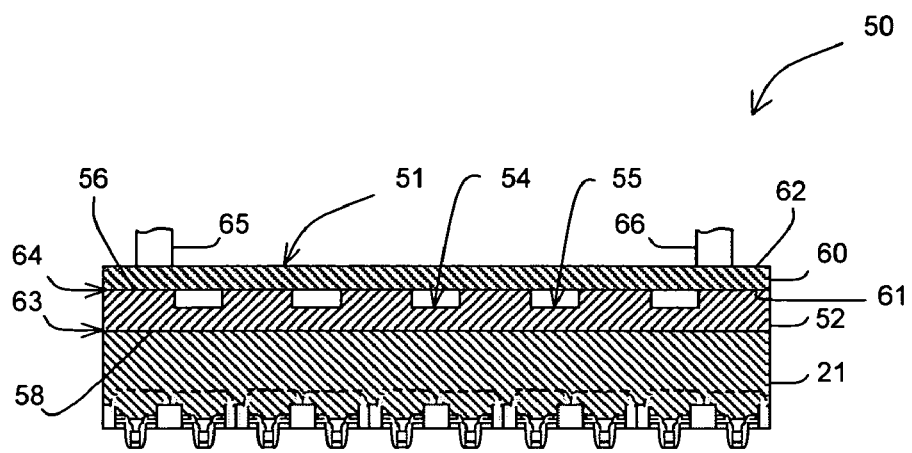
Figure 5:
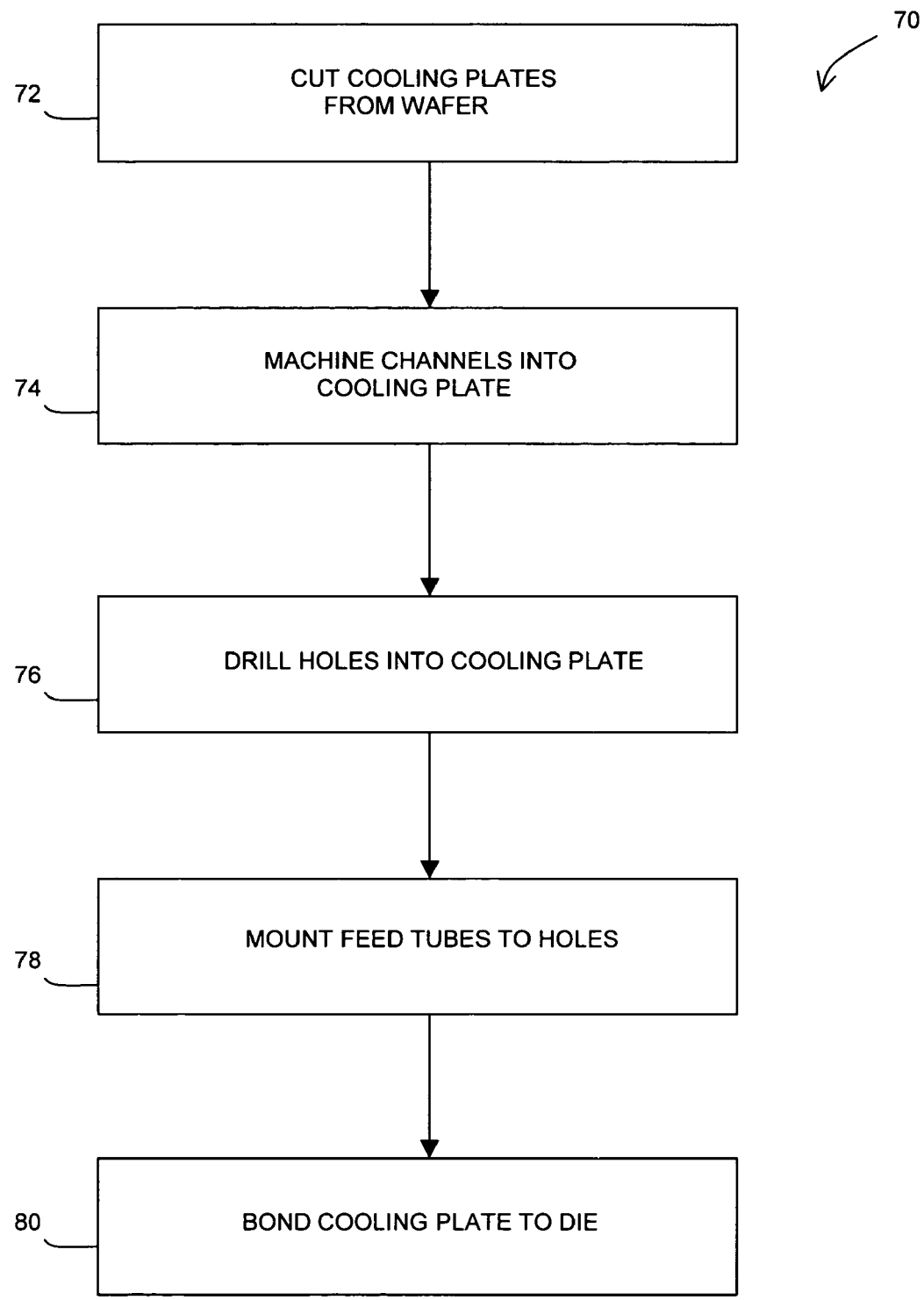
FIG. 5 is a flow chart of a manufacturing process, in accordance with one method of the present invention, for fabricating the electronic assembly shown in FIG. 2.

It is certified that error appears in the above-identified patent and that said Letters Patent is hereby corrected as shown below:

Column 1
Line 35, "FIG. 3 is …" should read --FIGS. 3A and 3B are…--.
Line 38, "FIG. 4 is…" should read --FIGS. 4A and 4B are…--.
Line 49, "…FIGS. 2 and 4, …" should read --…FIGS. 2 and 4A-4B, …--.

Column 2
Line 53, "…liquid-conducting passages 32…" should read --…liquid-conducting passages 30…--.

Column 3
Line 28, "…fluid inlet 38…" should read --…liquid inlet 38…--.

Column 4
Line 42, "…liquid flow tube 32…" should read --…liquid feed tube 32…--.

Column 5
Lines 14 & 16, "…PCB 92…" should read --…PCB 94…--.
Lines 15-16, "…IC package 12…" should read --…IC package 92…--.

Signed and Sealed this

Twenty-seventh Day of May, 2008

JON W. DUDAS
*Director of the United States Patent and Trademark Office*